(12) United States Patent
Fujii et al.

(10) Patent No.: US 8,217,276 B2
(45) Date of Patent: Jul. 10, 2012

(54) MULTILAYER PRINTED CIRCUIT BOARD AND METHOD OF MANUFACTURING MULTILAYER PRINTED CIRCUIT BOARD

(75) Inventors: Kentaro Fujii, Tokyo (JP); Yoshio Watanabe, Kanagawa (JP); Toru Takebe, Tokyo (JP)

(73) Assignee: Sony Corporation, Tokyo (JP)

( * ) Notice: Subject to any disclaimer, the term of this patent is extended or adjusted under 35 U.S.C. 154(b) by 1567 days.

(21) Appl. No.: 10/410,434

(22) Filed: Apr. 10, 2003

(65) Prior Publication Data

US 2003/0196833 A1 Oct. 23, 2003

(30) Foreign Application Priority Data

Apr. 22, 2002 (JP) ................................ P2002-119657

(51) Int. Cl.
*H05K 1/03* (2006.01)
(52) U.S. Cl. ........................................ 174/262; 174/257
(58) Field of Classification Search .......... 361/785–795, 361/803, 784; 174/261, 267, 257, 262–266; 29/839
See application file for complete search history.

(56) References Cited

U.S. PATENT DOCUMENTS

| | | | |
|---|---|---|---|
| 5,203,075 A * | 4/1993 | Angulas et al. ................... 29/830 |
| 5,279,711 A * | 1/1994 | Frankeny et al. .............. 174/263 |
| 5,907,007 A * | 5/1999 | Ito et al. ........................ 524/239 |
| 6,207,259 B1 * | 3/2001 | Iino et al. ....................... 428/209 |
| 6,245,594 B1 * | 6/2001 | Wu et al. ........................ 438/108 |
| 6,400,018 B2 * | 6/2002 | Clatanoff et al. ............... 257/737 |
| 6,554,180 B1 * | 4/2003 | Katoh et al. ................... 228/224 |
| 6,569,262 B1 * | 5/2003 | Shohji .............................. 148/24 |
| 2003/0038280 A1 * | 2/2003 | Kojo et al. ...................... 252/514 |
| 2005/0062168 A1 * | 3/2005 | Sano et al. ..................... 257/778 |

FOREIGN PATENT DOCUMENTS

| | | |
|---|---|---|
| JP | 56-145603 | 11/1981 |
| JP | 05-198946 | 8/1993 |
| JP | 182948 * | 7/1998 |
| JP | 11-112148 | 4/1999 |
| JP | 2000-086742 | 3/2000 |
| JP | 2001-077531 | 3/2001 |
| JP | 2001-160686 | 6/2001 |
| JP | 2001-325831 | 11/2001 |
| JP | 2001-352171 | 12/2001 |
| JP | 2001-358436 | 12/2001 |
| JP | 2001-358465 | 12/2001 |
| JP | 2002-111216 | 4/2002 |

OTHER PUBLICATIONS

Machine translation of JP 10-182948 (Jul. 7, 1998).*
www.dictionary.com definition of "rosin".*

* cited by examiner

*Primary Examiner* — Jeremy Norris
(74) *Attorney, Agent, or Firm* — Rader, Fishman & Grauer, PLLC (57) ABSTRACT

A multilayer printed circuit board which can surely establish interlayer connection with low resistance. The multilayer printed circuit board comprises: a first substrate having a conductive pattern on one face and a non-penetration connection hole on the other face, for exposing the conductive pattern to outside; a second substrate having a conductive pattern formed on a face opposed to the other face of first substrate and a conductive bump on the conductive pattern integrally. The first substrate and the second substrate are integrated by engaging the bump of the second substrate with the connection hole of the first substrate and by intervening a conductive cement between the bumps and the conductive pattern exposed to outside from the connection holes.

20 Claims, 10 Drawing Sheets

MULTILAYER PRINTED CIRCUIT BOARD AND METHOD OF MANUFACTURING MULTILAYER PRINTED CIRCUIT BOARD

CROSS REFERENCE TO RELATED APPLICATIONS

The present document is based on Japanese Priority Document JP2002-119657, filed in the Japanese Patent Office on Apr. 22, 2002, the entire contents of which being incorporated herein by reference.

BACKGROUND OF THE INVENTION

1. Field of the Invention

The present invention relates to a multilayer printed circuit board in which a plurality of conductive layers are electrically connected to each other through bumps, and to a method for manufacturing the multilayer printed circuit board.

2. Description of the Related Art

As a method of manufacturing a multilayer printed circuit board, there is a method of a so-called build-up process which is carried out as follows: at first, forming a conductive pattern on an inner layer substrate, then forming an insulating layer on the inner layer substrate formed the conductive pattern, and then further forming a conductive pattern on the insulating layer. Repeating this process, a plurality of conductive layers are formed. However, the build-up process has disadvantage such that if any failure occurs with a layer, all layers will be defective, thus productivity decreases. Further, in the build-up process, it tends to produce a defective product due to cracking in an insulating layer because a heat compression is repeated for laminating substrates. To avoid this problem, there is another method in which a multilayer printed circuit board is manufactured by integrating a plurality of substrates. Each substrate having a conductive pattern thereon is made individually, and laminating them having the insulating layers therebetween to be integrated. In this method, a metal bump is formed integrally on a conductive pattern at a position where an interlayer connection is established on each substrate. A conductive paste is adhered to tips of the metal bumps so as to integrate substrates; at the same time, an interlayer connection is established by press-welding the metal bumps with the conductive paste at the position where the interlayer connection is established on other substrate.

SUMMARY OF THE INVENTION

This conductive paste is made of, for example, copper particles having a particle diameter of 10 μm containing a hardener and an epoxy resin served as a binder. At the interlayer connection established part where the bumps are press-welded, conduction is achieved by point touching of the copper particles with tips of the bumps and the conductive pattern. For this reason, a resistance value is unstable or rises at the interlayer connection established part.

As another way of attempting the electrical connection between layers, there is a method in which a tin-lead solder is used to adhere to the position to be connected to one substrate. However, when the re-flow process is performed to the substrate for mounting electronic components, the tin-lead solder melts again and expands due to its low melting point: hence there may be possibly generated wire breaking.

In view of the conventional problems described above, the present invention provides a multilayer printed circuit board which surely achieves an interlayer connection with low resistance, and a method of manufacturing the multilayer printed circuit board.

More specifically, the present invention provides a multilayer printed circuit board which can prevent flow of a conductive cement used at a part where the interlayer connection is established so as to prevent a metal migration from being generated when joining layers, and providing a method of manufacturing the multilayer printed circuit board.

According to an embodiment of the present invention, a multilayer printed circuit board includes a first substrate having a conductive pattern formed on one face thereof and non-penetrated connection holes formed on the other face for exposing the conductive pattern to an outside, a second substrate having a conductive pattern formed on a face opposed to the other face of the first substrate and conductive bumps formed integrally on the conductive pattern, and an insulating layer formed between the first substrate and the second substrate, wherein, the first substrate and the second substrate are integrated by engaging the bumps of the second substrate with the connection holes of the first substrate, and by intervening a conductive cement between the bumps and the conductive pattern which is exposed to an outside from the connection holes.

Further, according to an embodiment of the present invention, a method of manufacturing a multilayer printed circuit board includes the steps of forming a conductive pattern on one face of a first substrate and non-penetrated connection holes exposing the conductive pattern to outside from the other face thereof, forming a conductive pattern on one face of a second substrate opposed to the other face of the first substrate and conductive bumps on the conductive pattern integrally, adhering a conductive cement to the bumps and/or bottoms of the connection holes, integrating the first substrate and the second substrate by engaging the bumps of the second substrate with the connection holes of the first substrate with an intervening insulating layer therebetween.

According to the multilayer printed circuit board of the present invention, the interlayer connection is established by engaging the conductive bumps formed integrally on the conductive patterns with the connection holes formed on the substrates. The multilayer printed circuit board is integrated by laminating the substrates where the bumps are engaged with the connection holes and heat-pressing them together. Therefore, the substrates can be laminated without displacement. In addition, the bumps and the lands are connected to each other through the conductive cement in the connection holes, so it can prevent spreading of the conductive cement and generating of metal migration because a single heat-pressing is enough. In addition, since the bumps and the lands are connected through the conductive cement, the interlayer connection is surely established.

DESCRIPTION OF THE PREFERRED EMBODIMENT(S)

Hereinafter, a multilayer printed circuit board, to which the present invention is applied, will be described in detail with reference to the accompanying drawings.

Figure 1:
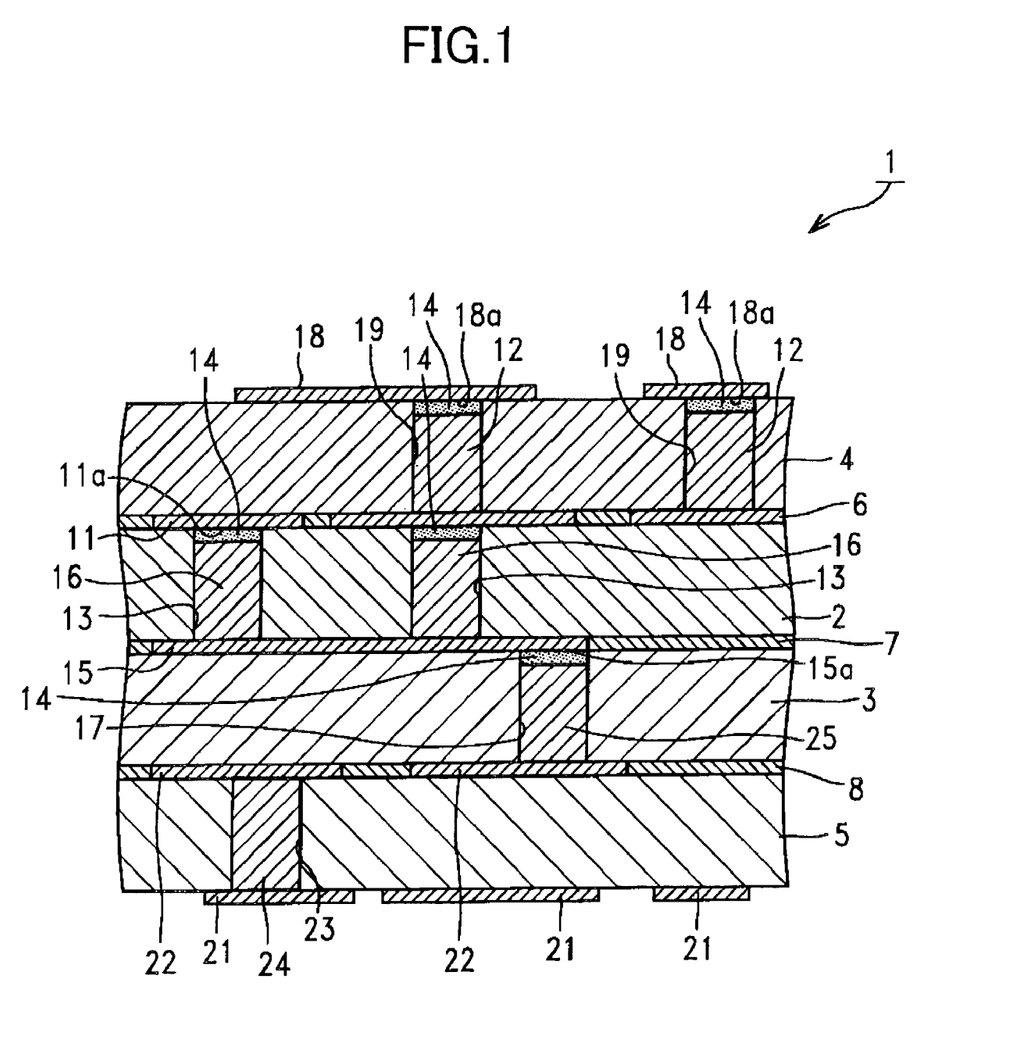
FIG. 1 is a sectional view of a main portion of a multilayer printed circuit board to which the present invention is applied.

As shown in FIG. 1, a multilayer printed circuit board 1 to which the present invention is applied has inner layer substrates 2, 3 and outer layer substrates 4, 5. The substrates 2, 3, 4, 5 are laminated each having insulating layers 6, 7, 8 therebetween, respectively, and are integrated together. The insulating layers 6, 7, 8 are used for adhering the adjacent substrates 2, 3, 4, 5. Here, it is preferred to use an adhesive agent, which serves as the insulating layers 6, 7, 8, having the same or similar plasticity as a resin used for the inner layer substrates 2, 3 and the outer layer substrates 4, 5. For example, when using glass fiber impregnated with a thermosetting epoxy resin for the substrates 2, 3, 4, 5, an epoxy adhesive agent being a thermosetting adhesive agent is used for the insulating layers 6, 7, 8. When using a thermoplastic resin for the substrates 2, 3, 4, 5, a thermoplastic adhesive is used for the insulating layers 6, 7, 8. Of course, either one of the resins, the thermosetting type or the thermoplastic type, may be used for the substrates 2, 3, 4, 5 and the other resin may be used for the insulating layers 6, 7, 8.

The inner layer substrates 2, 3 and the outer layer substrates 4, 5 are, for example, insulation substrates made of a glass fiber impregnated with the epoxy resin. The inner layer substrate 2 has an inner conductive pattern 11 formed on a face thereof by patterning a copper foil. On the conductive pattern 11, a plurality of metal bumps 12 are formed integrally in order to establish an interlayer connection to a conductive layer of the outer layer substrate 4. On the other face of the inner layer substrate 2, the conductive pattern is not provided but an insulating layer 7 is provided for adhering the inner substrate 3. Of course, the conductive pattern may also be provided on the other face of the inner layer substrate 2. The inner layer substrate 2 has connection holes 13 to be engaged with bumps 16 of the inner layer substrate 3. The connection holes 13 are not penetrated so that a part of the conductive pattern 11 at the bottom of the connection holes 13 are made to expose to an outside. The exposed bottom becomes lands 11a where the bumps 16 of the inner layer substrate 3 are press-welded. The bumps 16 and the land 11a provided on the inner layer substrate 3 are connected to each other with a conductive cement 14, which will be described later.

The inner layer substrate 3 has an inner conductive pattern 15 formed on a face thereof by patterning a copper foil. On the conductive pattern 15, a plurality of metal bumps 16 are formed integrally in order to establish the interlayer connection to the conductive pattern 11 of the inner layer substrate 2. On the other face of the inner layer substrate 3, the conductive pattern is not provided but an insulating layer 8 is provided for adhering the inner substrate 3. Of course, the conductive pattern may also be provided on the other face of the inner layer substrate 3. The inner layer substrate 3 has connection holes 17 to be engaged with bumps 25 provided on the inner layer substrate 5. The connection holes 17 are not penetrated so that a part of the conductive pattern 15 at the bottom of the connection holes 17 are made to expose to outside. The exposed bottoms become lands 15a where the bumps 25 provided on the inner layer substrate 5 are press-welded. The bumps 25 and the land 15a provided on the inner layer substrate 5 are connected to each other having the conductive cement 14 therebetween, which will be described later.

The outer layer substrate 4 has an outer conductive pattern 18 constituting an outer layer, formed by patterning a copper foil on a face thereof. On the other face of the outer layer substrate 4, the conductive pattern is not provided but an insulating layer 6 is provided for adhering to the inner substrate 2. Of course, the conductive pattern may also be provided on the other face of the outer layer substrate 4. The outer layer substrate 4 has connection holes 19 to be engaged with the bumps 12 of the inner layer substrate 2. The connection holes 19 are not penetrated so that a part of the conductive pattern 18 at the bottom of the connection holes 19 are made to be exposed to the outside. The exposed bottoms become lands 18a where the bumps 12 of the inner layer substrate 2 are press-welded. The bumps 12 and the lands 18a provided on the inner layer substrate 2 are connected to each other with the conductive cement 14 therebetween, which will be described later.

The outer layer substrate 5 has an outer conductive pattern 21 constituting an outer layer, formed by patterning a copper foil on a face thereof. On the other face of the outer layer substrate 5, the conductive pattern 22 is also formed. Between the conductive pattern 21 and the conductive pattern 22, the interlayer connection is established through penetrated holes 23. More specifically, the interlayer connection between the conductive pattern 21 and the conductive pattern 22 is established by filling a conductive paste 24 into the penetrated holes 23. The interlayer connection may be established by providing a conductive layer inside the penetrated holes 23 with copper plating or the like and filling inside the holes permanently, or by filling the whole penetrated holes with copper plating or the like. On the conductive pattern 22, a plurality of bumps 25 are formed integrally in order to establish the interlayer connection to the conductive pattern 15 of the inner layer substrate 3. The bumps 25 and the lands 15a provided on the conductive pattern 15 of the inner layer substrate 3 are connected to each other with the conductive cement 14 therebetween, which will be described later.

In the multilayer printed circuit board 1 described above, the interlayer connection is established by press-welding after engaging the conductive bumps 12, 16, 25 formed integrally on the conductive patterns 11, 15, 18, 22 with the connection holes 13, 17, 19 formed on the substrates 2, 3, 4.

The multilayer printed circuit board 1 is formed by laminating the substrates 2, 3, 4, 5 where the bumps 12, 16, 25 are engaged with the connection holes 13, 17, 19 to be positioned and heat-pressing them together to be integrated. Therefore, in the multilayer printed circuit board 1, the substrates 2, 3, 4, 5 can be laminated without displacement. In addition, in the multilayer printed circuit board 1, the bumps 12, 16, 25 and the lands 11a, 15a, 18a are connected to each other through the conductive cement 14 in the connection holes 13, 17, 19, respectively. Therefore, it can prevent spreading of the conductive cement 14 and generating of metal migration caused by spreading of the conductive cement 14 because a single heat-pressing is enough to be performed. In addition, since the bumps 12, 16, 25 and the lands 11a, 15a 18a are connected through the conductive cement 14, the interlayer connection is surely established. Further, the substrates 2, 3, 4, 5 are adhered to each other with an epoxy adhesive also serving as the insulating layer 6, 7, 8, the multilayer printed circuit board 1 can be produced thinner.

Figure 2:
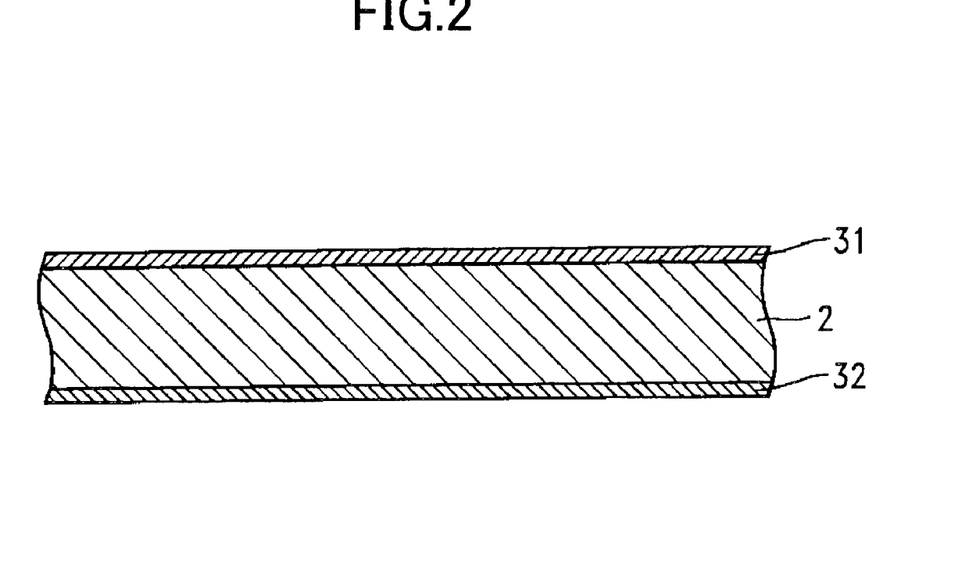
FIG. 2 is a sectional view of a main portion of an inner layer substrate having a copper foil constituting an electrically conductive layer adhered on both sides thereof.

Next, a method of manufacturing the above described multilayer printed circuit board 1 is described with reference to the accompanying drawings. At first, a method for manufacturing an inner layer substrate 2 on which bumps 12 and connection holes 13 are formed is described with reference to the drawings. As shown in FIG. 2, copper foils are laminated on both sides of the inner layer substrate 2 to be conductive layers 31, 32. Here, the conductive layer 31 on one face of the inner layer substrate 2 is to be a conductive pattern 11, and the conductive layer 32 on the other face will be removed in a later process.

Figure 3:
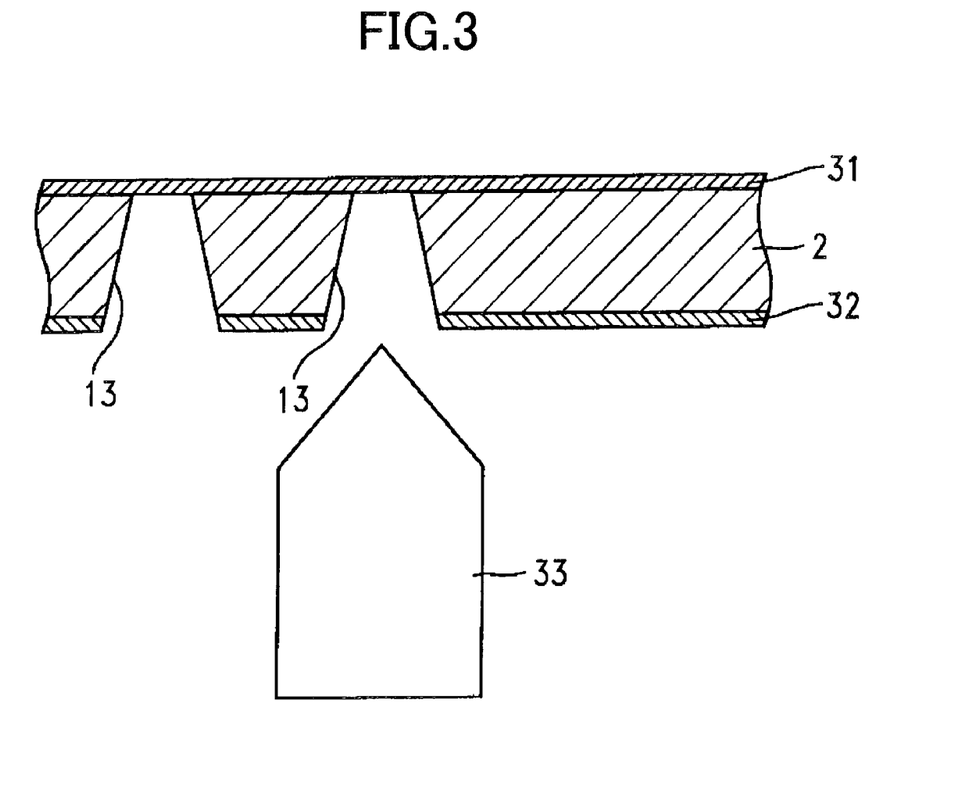
FIG. 3 is a sectional view of a main portion of the inner layer substrate showing a state in which connection holes are formed thereon.

Connection holes 13 are formed using a laser 33 as shown in FIG. 3, at a position where an interlayer connection is established between the conductive pattern 11 and a conductive pattern 15 of an inner layer substrate plate 3 in the inner layer substrate 2. These connection holes 13 are formed using the laser 33 so that the conductive layer 31 on one face of the inner layer substrate 2 is exposed. More specifically, the connection holes 13 are formed by exposing with ultraviolet radiation using the photosensitive insulating material so as to meet the diameter of the hole to be formed, or using the $CO_2$ laser, the excimer laser, Nd:YAG laser, plasma or the like. After this process, a desmear treatment is performed to the inner layer substrate 2 so that resin dregs inside the connection hole 13 are chemically removed.

Figure 4:
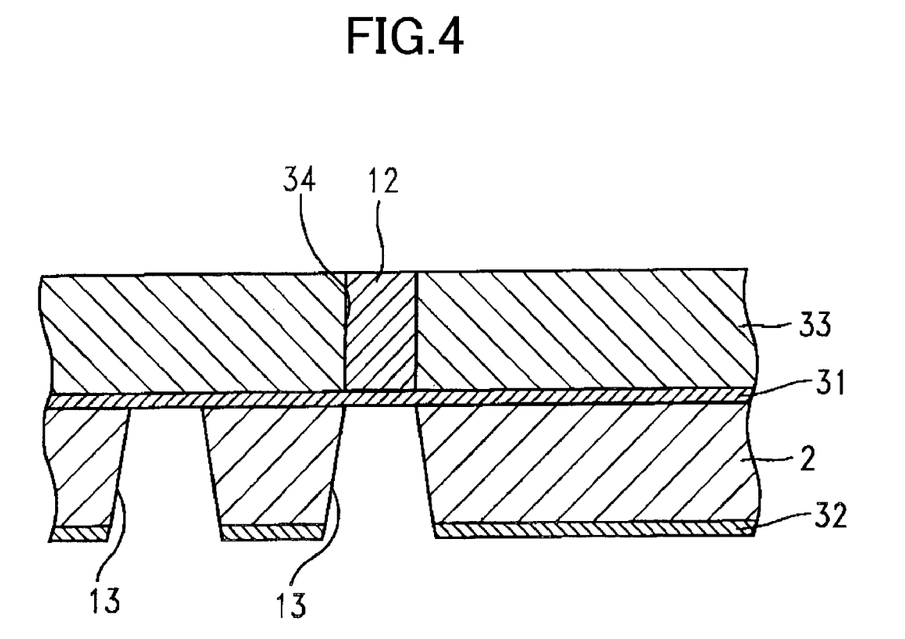
FIG. 4 is a sectional view of a main portion of the inner layer substrate showing a state in which a photosensitive plating resist is provided on a copper foil and bumps are formed.
Figure 5:
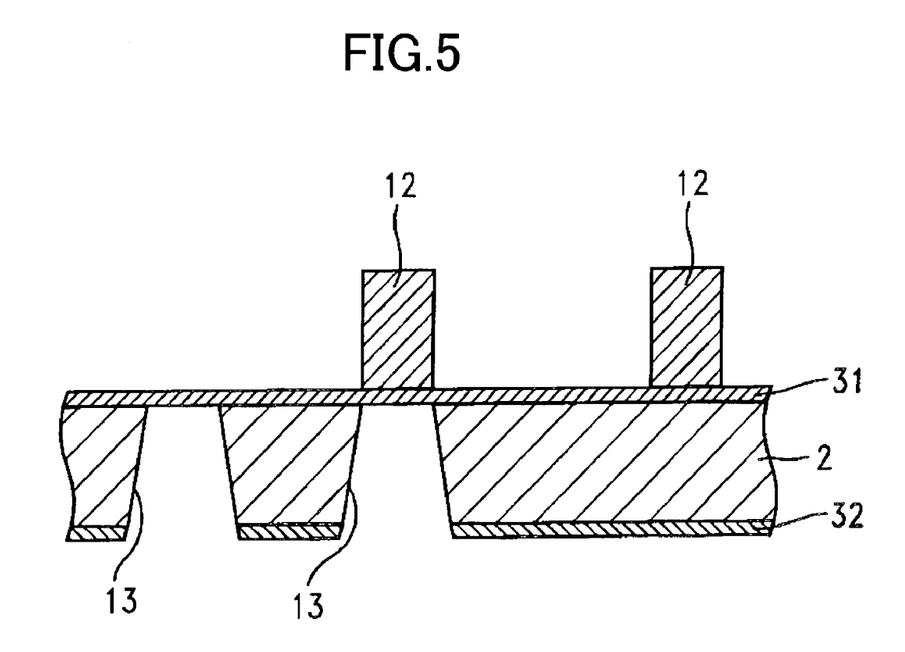
FIG. 5 is a sectional view of a main portion of the inner layer substrate showing a state in which the bumps are formed.

As shown in FIG. 4, a photosensitive plating resist 33 is provided onto the conductive layer 31 of the inner layer substrate 2 in order to form bumps 12. After exposing using an exposure film, the photosensitive plating resist 33 is developed. By performing the above process, in the photosensitive plating resist 33, openings 34 are formed in order to expose the conductive layer 31 to the outside at a region where the bumps 12 are to be formed. Subsequently, copper is separated out to an inside of the opening 34 by the electroless plating or by the electrolytic plating, and the bumps 12 are formed integrally on the conductive layer 31. After that, as shown in FIG. 5, unnecessary photosensitive plating resist 33 is exfoliated from the inner layer substrate 3.

Figure 6:
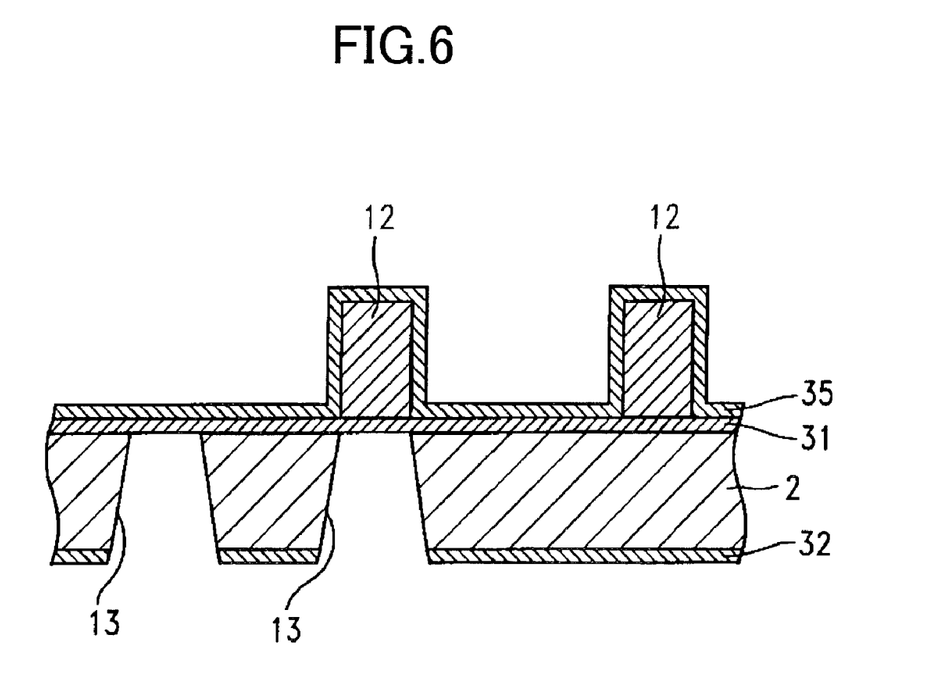
FIG. 6 is a sectional view of the inner layer substrate showing a state in which a resist is formed on the copper foil for forming a conductive pattern thereon.
Figure 7:
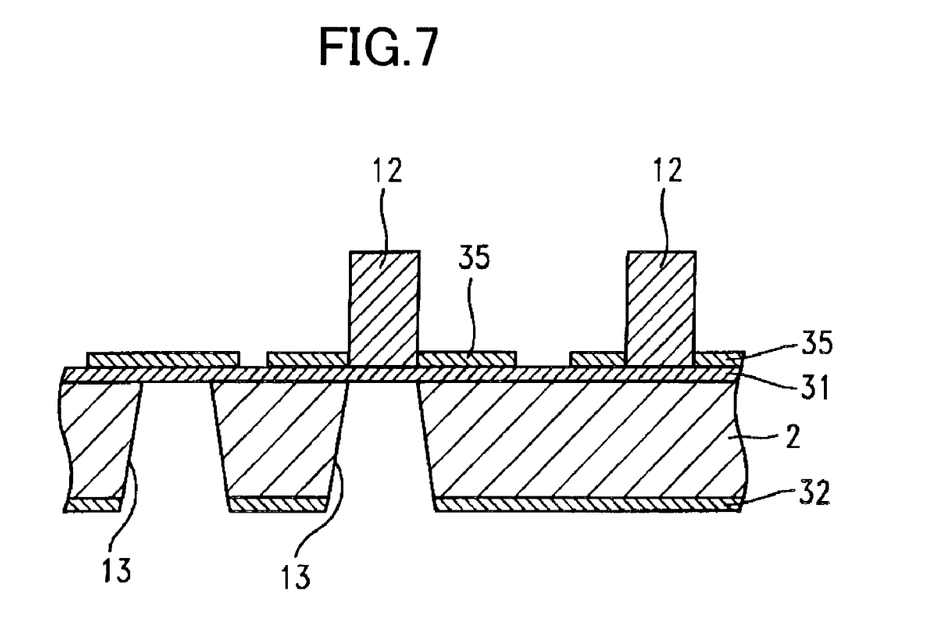
FIG. 7 is a sectional view of a main portion of the inner layer substrate showing a state in which the resist is removed selectively in accordance with the conductive pattern.
Figure 8:
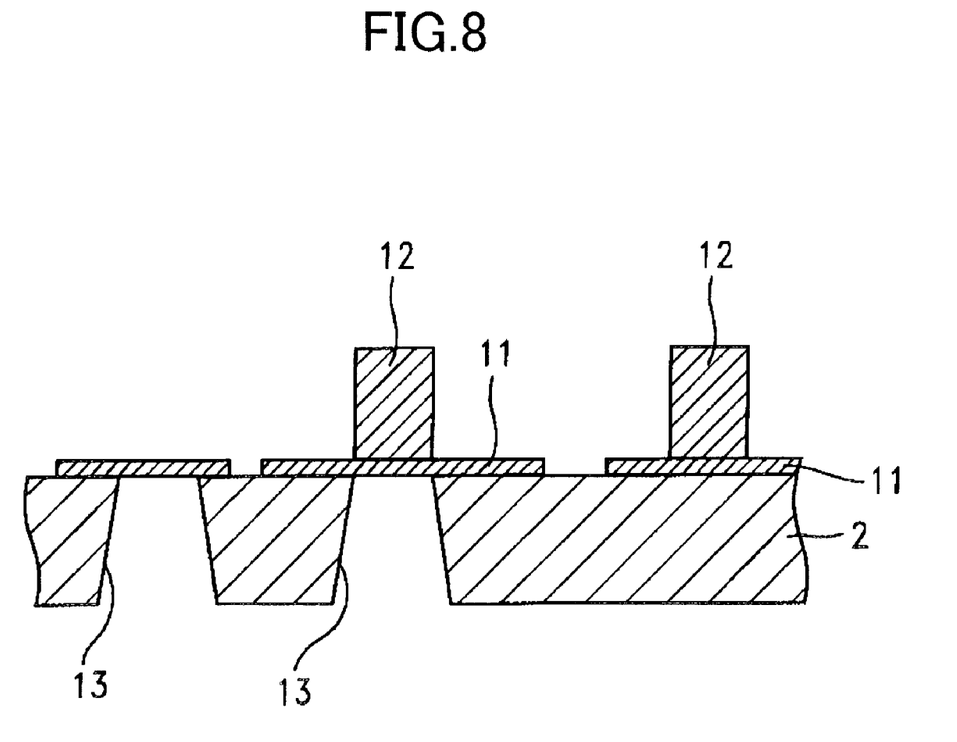
FIG. 8 is a sectional view of a main portion of the inner layer substrate in which the conductive pattern is formed.
Figure 9A:
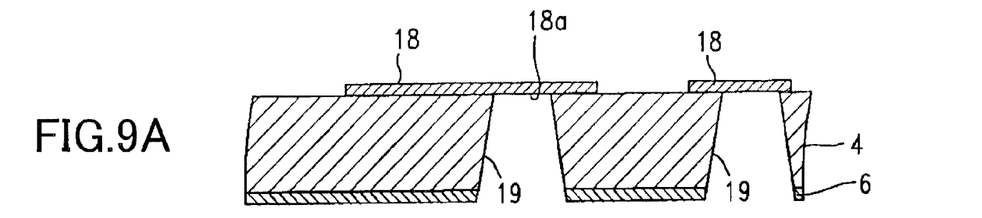
FIGS. 9A-9D are sectional views separately showing a state of substrates to be laminated.
Figure 9B:
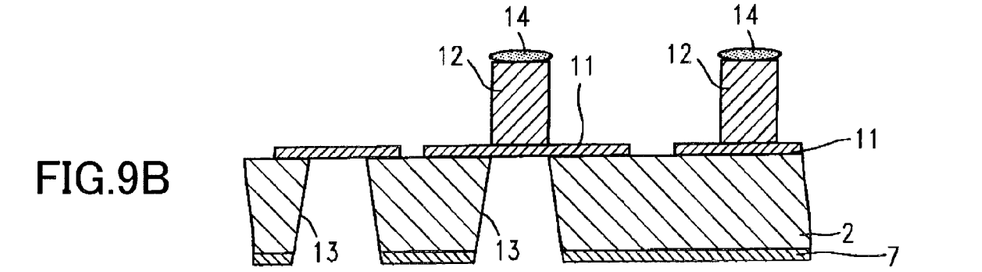
Figure 9C:
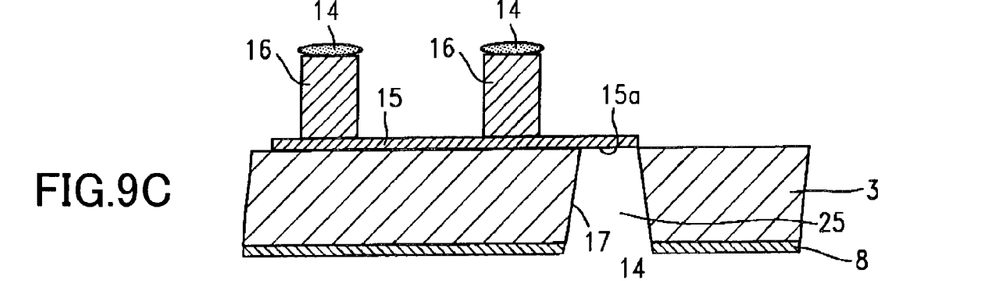
Figure 9D:
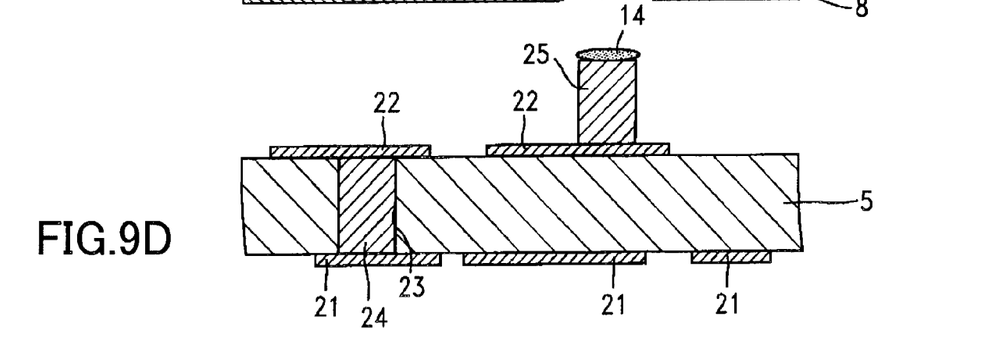
Figure 10A:
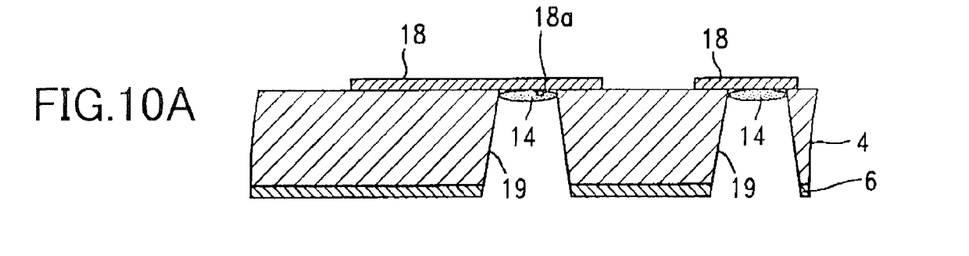
FIGS. 10A-10D are sectional views separately showing a state in which a conductive cement is adhered to the inside of connection holes.
Figure 10B:
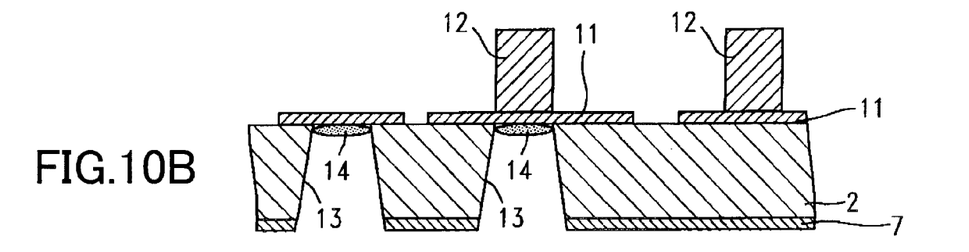
Figure 10C:
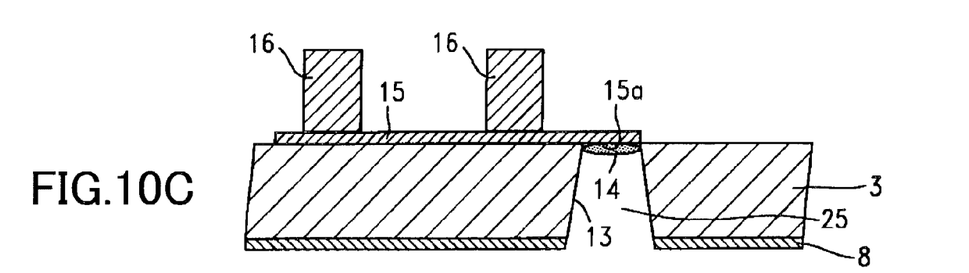
Figure 10D:
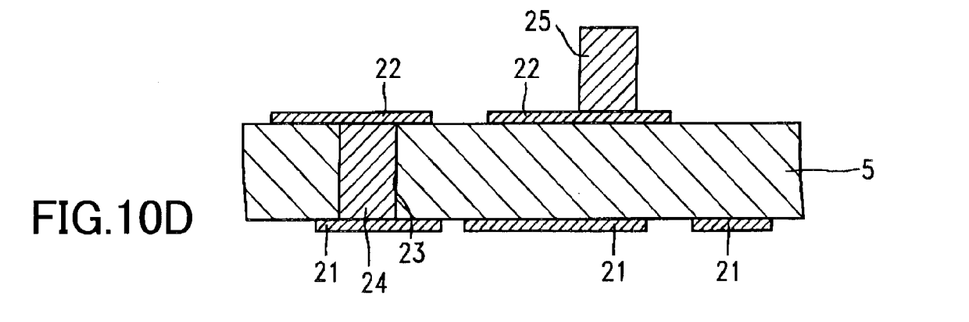

As shown in FIG. 6, a resist 35 is electro-depositioned on the conductive layer 31 on which the bumps 12 are formed in order to form the conductive pattern 11 by patterning the conductive layer 31. This resist 35 is exposed by using the photo film for forming the conductive pattern 11 and developed. As shown in FIG. 7, this process removes the resist 35 in the regions where the conductive pattern 11 is not formed. As shown in FIG. 8, the conductive layer 31 is selectively etched, subsequently. Namely, only the regions where the resist 35 is removed on the conductive layer 31 are etched.

The remaining resist 35 is removed from the conductive layer 31. Further, the conductive layer 32 of the other face of the inner layer substrate 2 is also removed by etching. Therefore, the bumps 12 are formed to be integrated on the conductive pattern 11 of the inner layer substrate 3.

In addition, bumps 16 and connection holes 17 are formed on an inner layer substrate 3 in the same manner as on the inner layer substrate 2, therefore detail description of its process is omitted. Also, since an outer layer substrate 4 can be formed in the same manner as on the inner layer substrate 2 except that no bumps are formed, a detailed description of its process is omitted. Next, an outer layer substrate 5 is formed as follows, that is, after penetrated holes 23 are formed using a drill in a copper-clad laminate board as shown in FIG. 2, and a conductive paste 24 is filled in the penetrated holes 23, conductive patterns 21, 22 and bumps 25 are formed thereon in accordance with a method shown in FIG. 4 to FIG. 7.

The substrates 2, 3, 4, 5, each having the patterned conductive layers thereon as shown in FIGS. 9A to 9D, respectively, are laminated to be integrated. When laminating these substrates, an epoxy adhesive, which is a thermoplastic adhesive and serves also as an insulating layer, is adhered to the other face of the inner layer substrate 2, to the other face of the inner layer substrate 3 and to the other face of the outer layer substrate 4. Thus, the substrates 2, 3, 4, 5 are laminated after positioning relative to each other by engaging the bumps 12 of the inner layer substrate 2 with the connection holes 19 of the outer layer substrate 4, the bumps 16 of the inner layer substrate 3 with the connection holes 13 of the inner layer substrate 2, and the bumps 25 of the outer layer substrate 5 with the connection holes 17 of the inner layer substrate 3.

When laminating the substrates 2, 3, 4, 5, as shown in FIGS. 9A to 9D, a conductive cement 14 is adhered to tips of bumps 12, 16, 25.

Here, as the conductive cement 14, for example, those in which conductive colloidal particles are uniformly dispersed with a dispersant are used. The conductive colloidal particles are conductive particles having a diameter of about several nm to 100 nm. They are produced by, for example, evaporating metal in an inactive gas such as helium or argon, and hitting colliding metal atom to a gas molecular, then cooling rapidly to condense. Because such a colloidal particle is usually a nanoparticle, which is highly active and whose melting point is low. For example, silver has a melting point 960.8° C., however, a colloidal particle of silver is sintered at a lower temperature than its melting point, concretely around 100° C. Therefore, using the conductive cement 14, the temperature for welding the bumps 12, 16, 25 and the lands 11a, 15a, 18a can be lowered.

As the colloidal particles, for example, the silver which is hard to be oxidized is used. In order to disperse the particles with dispersant, the silver colloidal particles having a diameter of 10 nm to 50 nm are used. This is because it is difficult to disperse with dispersant if the silver colloidal particles are larger than 50 nm in their diameters. Although a smaller colloidal particle is better, those with a diameter of 10 nm are used in terms of current manufacturing technology.

In the conductive cement 14, with the colloidal particle such as above, a resin served as a dispersant is mixed in. For example, an acrylic resin is used as the dispersant. A necessary quantity of dispersant for dispersing the colloidal particles is about 6% by weight with respect to the colloidal particles 94% by weight after drying. Namely, the conductive cement 14 contains less resin than the conventional conductive paste so that a resistance value at junctions between the bumps 12, 16, 25 and the lands 11a, 15a, 18a can be lowered. In addition, molecular weight of the resin to be used as the dispersant is around 10000.

Further, only the colloidal particle in the conductive cement 14 may be used for joining the bumps 12, 16, 25 and the lands 11a, 15a, 18a.

Furthermore, in the conductive cement 14, particles which are larger than colloidal particles are mixed. The particles are tin silver alloy which can improve adhesiveness between the bumps 12, 16, 25 and the lands 11a, 15a, 18a. The composition ratio of silver to tin in the tin silver alloy is 3.5 to 96.5. As described above, being adhered to the tips of the bumps 12, 16, 25, the conductive cement 14 becomes well-matched with the tin silver solder and the tin silver plating provided on the lands 11a, 15a, 18a; thus adhesiveness between the bumps 12, 16, 25 and the lands 11a, 15a can be improved. The particle of the tin silver alloy is lager than the colloidal particle, around 10 μm, so that the conductive cement 14 containing the tin silver alloy can eliminate difference in height of each of the bumps 12, 16, 25; thus joining with the lands 11a, 15a, 18a can surely be achieved.

In a silver colloidal solution, which is produced by mixing the dispersant into the silver colloidal particles and adjusted with water, the composition ratio of the silver colloidal solution to the tin silver alloy is from 1:1 to 10:1 by weight. This composition ratio is decided in consideration of the adhesiveness between the bumps 12, 16, 25 and the lands 11a, 15a, 18a, and of height difference of each bumps 12, 16, 25.

Moreover, to the conductive cement 14, as particles for improving the adhesiveness between the bumps 12, 16, 25 and the lands 11a, 15a, 18a, copper particles coated with silver may be mixed in with the tin silver alloy or instead of the tin silver alloy. The particle coated with silver has, for example, a diameter of 10-100 μm. Using these particles, the conductive cement 14 becomes well-matched with the tin silver solder and the tin silver plating provided on the lands 11a, 15a, 18a, and the copper foils served as the lands 11a, 15a, 18a; thus adhesiveness between the bumps 12, 16, 25 and the lands 11a, 15a can be improved. As in the case mixing the tin silver alloy therein, a height difference of the bumps 12, 16, 25 can be controlled.

Furthermore, to the conductive cement 14, the particles of exothermic material having a diameter of 10-100 μm are mixed in for surely joining the bumps 12, 16, 25 and the lands 11a, 15a, 18a when integrating the substrates 2, 3, 4, 5 by press-welding with heat while having the insulating layers 6, 7, 8 therebetween. As the particle of the exothermic material, graphite, ferrite, silicon carbide, barium titanate, and alumina are used. Hereby when integrating the substrates 2, 3, 4, 5 by press-welding with heat, the bumps 12, 16, 25 and the lands 11a, 15a, 18a can surely be joined.

The conductive cement 14 composed as above is adjusted around 10 P (poise) with, for example, water of 25% by weight. The conductive cement 14 is adhered to the tips of bumps 12, 16, 25, by dipping the tips of the bumps 12, 16, 25 into the conductive cement retained in a reservoir and dried with heat at 100° C. for one minute. There are other methods for adhering the conductive cement 14 to the tips of the bumps 12, 16, 25 such as by using the ink-jet, the printing and the dispenser or the like.

The colloidal particle used in the conductive cement 14 may be gold, copper in addition to silver. Also, as the conductive cement 14, a conductive paste containing particles such as existing copper, silver, carbon may be used in addition to using the above mentioned colloidal particles. In addition, the conductive cement 14 may be adhered to the lands 11a, 15a, 18a together with the tips of bumps 12, 16, 25, or may be adhered to only the lands 11a, 15a, 18a, as described later.

After the conductive cement 14 is adhered to the tips of bumps 12, 16, 25 so as to laminate the substrates 2, 3, 4, 5, the laminated substrates 2, 3, 4, 5 are placed on a compression apparatus. The compression apparatus can pressurize more than 30 kg/cm² and can heat to a maximum of 400° C. Here, a method of manufacturing a multilayer printed circuit board 1 is explained taking a case where the use of silver for the colloidal particles. While pressurizing the laminated substrates 2, 3, 4, 5 with pressure of 30 kg/cm², heating it at 130° C. for 30 minutes so that the epoxy insulating layers 6, 7, 8, which is a thermosetting resin and serves as an adhesive, are softened. Subsequently, while pressurizing under the same condition, heating the laminated substrates at 180° C. for 70 minutes so that the epoxy resin, which is a thermosetting resin, is hardened. Subsequently, while pressurizing under the same condition, heating the laminated substrates at 260° C. for 10 minutes so that joining part of the bumps 12, 16, 25 and the land 11a, 15a, 18a are melted. Consequently, the substrates 2, 3, 4, 5, are integrated, and the multilayer printed circuit board 1 as shown in FIG. 1 can be performed. Further, this integration process can be performed by a method in which after heating up to 90° C. under the same pressurizing condition, the laminated substrates are heated at 90° C.-2° C./minute up to 180° C. and maintained as they are for 40 minutes.

When using a high frequency, while pressurizing the laminated substrates with a pressure of 30 kg/cm², heating them at 130° C. for 30 minutes, and then while pressurizing under the same condition, heating them at 180° C. for 70 minutes for hardening the glass epoxy resin which is a thermosetting resin. In this method, the frequency is 2.45 GHz, a power output is 500 W, and an irradiation time is one to two minutes.

In the above described manufacturing method, the interlayer connection is established by engaging the bumps 12, 16, 25 formed integrally on the conductive patterns 11, 15, 18, 22 with the connection holes 13, 17, 19 provided on the substrates 2, 3, 4. In other words, the multilayer printed circuit board 1 can be fabricated by a method in which the substrates 2, 3, 4, 5 are each laminated after positioning, and are heat-pressed. In addition, in the method, the bumps 12, 16, 25 and the lands 11a, 15a, 18a are connected to each other through the conductive cement 14 in the connection holes 13, 17, 19, the conductive cement 14 can be prevented from spreading. Further, since heat compression is enough to be performed only once, generation of metal migration can be prevented. Also, since the connection between the bumps 12, 16, 25 and the lands 11a, 15a, 18a is carried out through the conductive cement, the interlayer connection is surely established. Furthermore, by using the epoxy adhesive served as the insulating layers 6, 7, 8 for adhering the substrates 2, 3, 4, 5, it is possible to make the multilayer printed circuit board thinner.

When the colloidal particles are used in the conductive cement 14, temperature at the heat compression can be lowered; thus manufacture efficiency can be improved. Since the conductive cement 14 contains less resin than those conventional conductive paste, the resistance value at the position of the interlayer connection can be lowered.

Figure 11A:
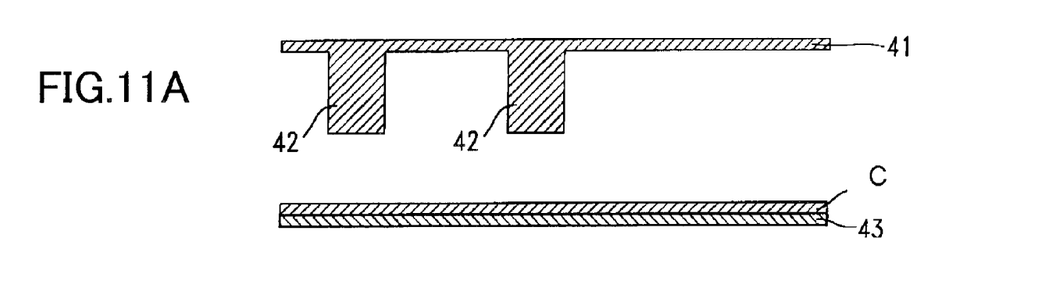
FIGS. 11A and 11B are views explaining a method copying the paste-like conductive cement onto insides of the connection holes using an adhered member.

It has been described with the example in which the substrates 2, 3, 4, 5 are laminated after the conductive cement 14 is adhered to the tips of the bumps 12, 16, 25. However, in the present invention, the substrates 2, 3, 4, 5 may be laminated after the conductive cement 14 is adhered to the bottom of the connection holes 13, 17, 19, namely, to the lands 11a, 15a, 18a, as separately shown in FIGS. 10A to 10D. Now, described here is an adhering jig which is used for adhering the conductive cement 14 to the lands 11a, 15a, 18a at the bottom of the connection holes 13, 17, 19. As shown in FIG. 11A, a jig 41 has an adhering portion 42 used for adhering the conductive cement 14 to the lands 11a 15a, 18a at the bottom of the connection holes 13, 17, 19. The adhering portion 42 is formed at least longer than the depth of the connection holes 13, 17, 19, and has a tip capable of holding the paste-like conductive cement 14.

Figure 11B:
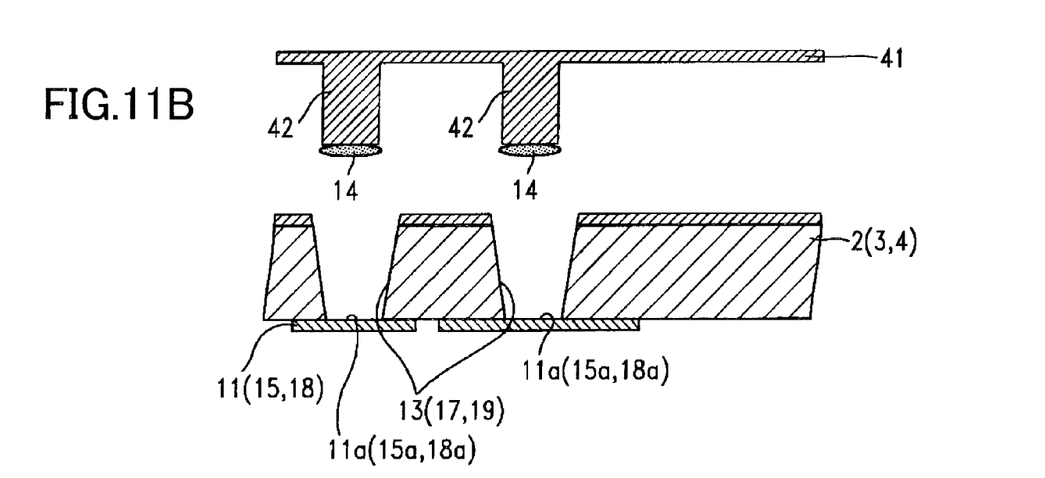

When making the adhering portion 42 to hold the paste-like conductive cement 14, the jig 41 is moved in the direction of a reservoir 43 where the conductive cement 14 is retained in paste form (C in FIG. 11A) by a not-shown drive mechanism. When the adhering portion 42 is dipped into the conductive cement C in the reservoir 43, a tip of the adhering portion 42 holds the paste-like conductive cement 14. Subsequently, as shown in FIG. 11B, the jig 41 holding the conductive cement 14 at the adhering portion 42 is moved in the direction of the connection holes 13, 17, 19 of the substrates 2, 3, 4 by the drive mechanism. By moving the jig 41 to approach the connection holes 13, 17, 19 of the substrates 2, 3, 4 by the drive mechanism, the paste-like conductive cement 14 held at the adhering portion 42 is transferred onto the lands 11a, 15a, 18a at the bottom of the connection holes 13, 17, 19.

Figure 12A:
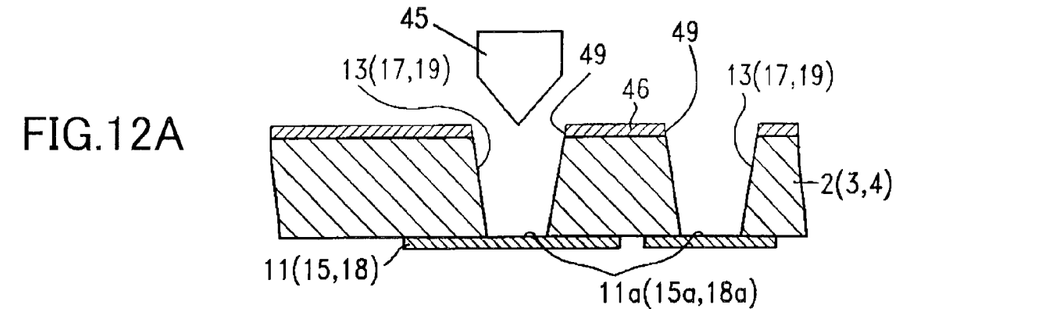
FIGS. 12A-12D are views explaining a method copying the paste-like conductive cement onto insides of the connection holes using the screen printing technology.

There is another method for transferring the conductive cement 14 onto the lands 11a 15a, 18a at the bottom of the connection holes 13, 17, 19. The method is explained below with reference to FIGS. 12A to 12D. At first, a masking film 46 is attached on the face at opening side of the connection holes 13, 17, 19 of the substrates 2, 3, 4 as shown in FIG. 12A. The masking film 46 on regions where the connection holes 13, 17, 19 are formed is removed using a laser 45 so as to form openings 49. In this example, the conductive cement 14 is printed on the lands 11a, 15a, 18a at the bottom of the connection holes 13, 17, 19 by the screen printing technology.

Figure 12B:
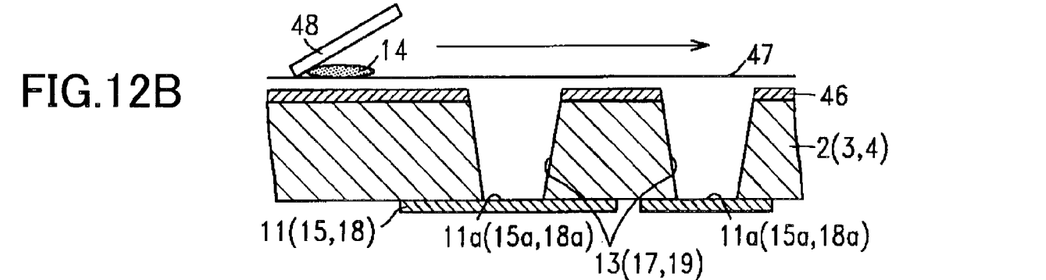
Figure 12C:
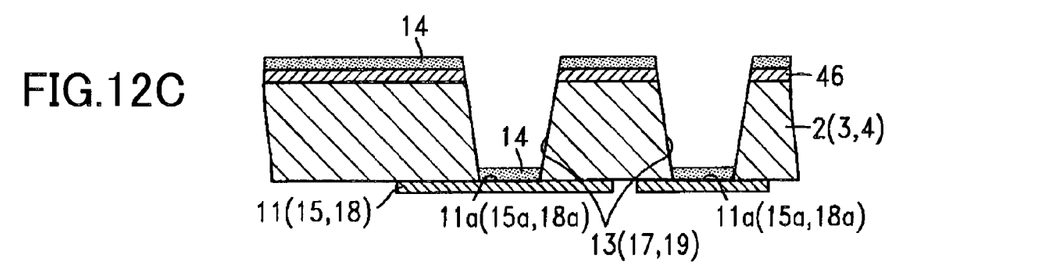
Figure 12D:
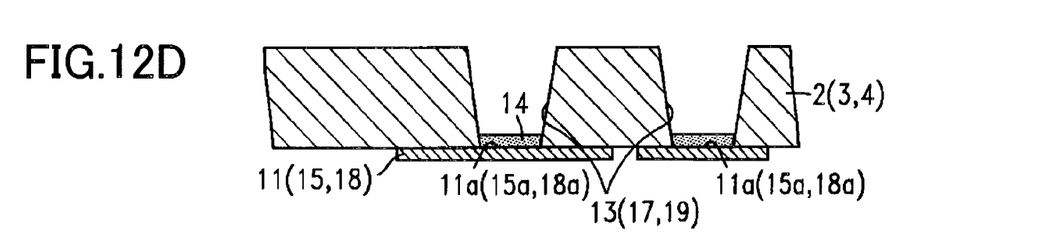

As shown in FIG. 12B, at first, placing a screen 47 having patterns corresponding to the connection holes 13, 17, 19 on the substrates 2, 3, 4. The paste-like conductive cement 14 is supplied onto the screen 47, a squeegee 48 moves on the screen 47, and then the conductive cement 14 is printed on the masking film 46 on the substrates 2, 3, 4 as shown in FIG. 12C. At this time, since the masking film 46 has openings 49 corresponding to the connection holes 13, 17, 19, the conductive cement 14 is printed not only onto the masking film 46 but also printed onto the lands 11a, 15a, 18a being exposed to the outside from the opening 49. After that, as shown in FIG. 12D, the masking film 46 is removed from the substrates 2, 3, 4. After the above process, the conductive cement 14 is printed only on the lands 11a, 15a, 18a at the bottom of the connection holes 13, 17, 19.

According to the above method in which the substrates 2, 3, 4, 5 are laminated to be integrated after adhering the conductive cement 14 into the connection holes 13, 17, 19, the conductive cement 14 can be prevented from spreading to regions other than the connection holes 13, 17, 19.

By the way, a multilayer printed circuit board to which the present invention is applied may be formed as shown separately in FIGS. 13A to 13D. A multilayer printed circuit board 51 is formed with an insulation substrate having conductive patterns on both faces like the outer layer substrate 5 described above as an inner layer substrate. More specifically, as separately shown in FIGS. 13A to 13B, the multilayer printed circuit board 51 has inner layer substrates 52, 53 and outer layer substrates 54, 55.

Figures 13A, 13B:
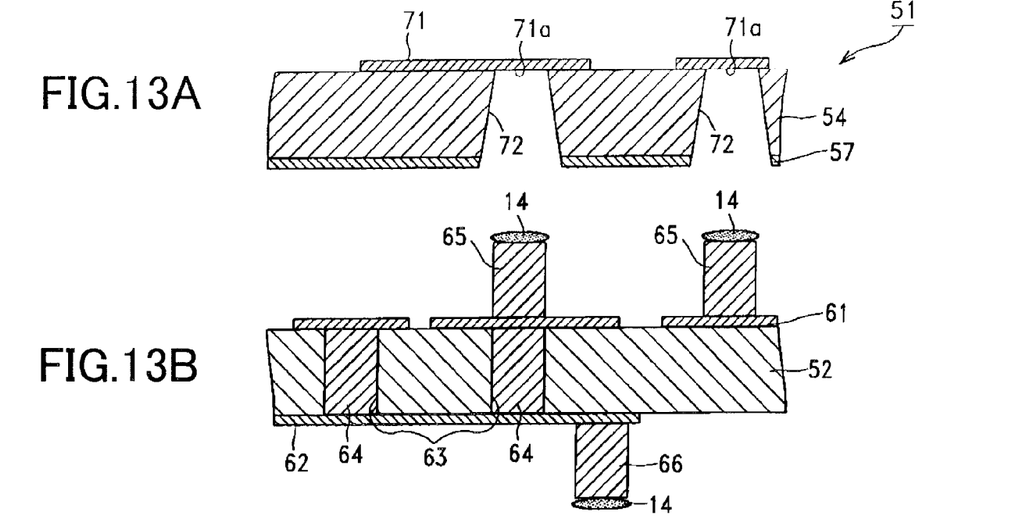
FIGS. 13A-13D are views of a main portion explaining the multilayer printed circuit board using the substrates having electrically conductive layers on both sides as the inner layer substrate.

As shown in FIG. 13B, the inner layer substrate 52 has conductive patterns 61, 62 constituting an inner layers formed by patterning copper foils on both faces. Between the conductive pattern 61 and the conductive pattern 62, an interlayer connection is established through penetrated holes 63 provided on the inner layer substrate 52. More specifically, the interlayer connection between the conductive pattern 61 and the conductive pattern 62 is established by filling a conductive paste 64 into the penetrated holes 63. Or, the interlayer connection may be established by providing a conductive layer onto an inner peripheral surface of the penetrated holes 63 by copper metal plating and filling the penetrated holes 63 permanently. In addition, on the conductive pattern 61, a plurality of metal bumps 65 are formed integrally in order to establish the interlayer connection to a conductive pattern 71 of the outer layer substrate 54. On the conductive pattern 62, a plurality of metal bumps 66 are formed integrally in order to establish the interlayer connection to a conductive pattern 67 of the inner layer substrate 53. And the conductive cement 14 is adhered to the tips of bumps 65, 66.

Figure 13C:
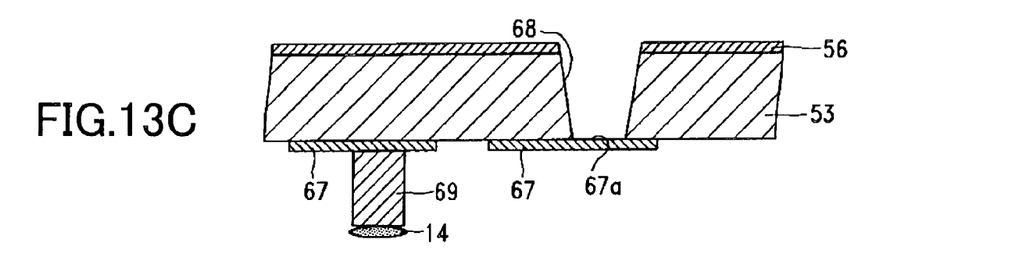

As shown in FIG. 13C, the inner layer substrate 53 does not have a conductive pattern at one face but has an insulating layer 56 for adhering the inner layer substrate 52. On the other face of the inner layer substrate 53, an inner conductive pattern 67 is formed by patterning a copper foil. At one face of the inner layer substrate 53, connection holes 68 are formed in order to engage with the bumps 66 of the inner layer substrate 52. The connection holes 68 are not penetrated so that a part of the conductive patterns 67 at the bottom are made to be exposed to the outside. The exposed bottoms are to be lands 67a where the bumps 66 of the inner layer substrate 52 are press-welded. The lands 67a and the bumps of the inner layer substrate 52 are connected to each other through the conductive cement 14. Furthermore, on the conductive pattern 67, a plurality of metal bumps 69 is formed integrally in order to establish the interlayer connection to the conductive pattern 73 of the outer layer substrate 55.

As shown in FIG. 13A, the outer layer substrate 54 has an outer conductive pattern 71 formed on a face thereof by patterning copper foil. On the other face of the outer layer substrate 54, a conductive pattern is not formed but an insulating layer 57 is provided for adhering to the inner substrate 52. Of course, the conductive pattern may also be provided on the other face of outer layer substrate 54. The outer layer substrate 54 has connection holes 72 to be engaged with bumps 65 of the inner layer substrate 52. The connection holes 72 are not penetrated so that a part of the conductive pattern 71 at the bottoms of the connection holes 72 are made to expose to outside. The exposed bottoms become lands 71a where the bump 65 of the inner layer substrate 52 are press-welded. The lands 71a and the bumps 65 of the inner layer substrate 52 are connected to each other through the conductive cement 14.

Figure 13D:
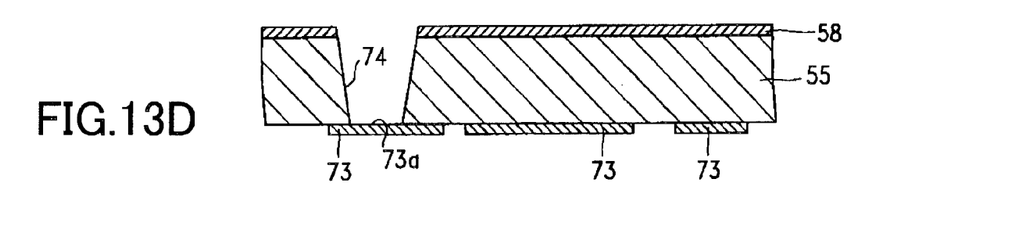

As shown in FIG. 13D, the outer layer substrate 55 has a face having an outer conductive pattern 73 formed on a face thereof by patterning copper foil. On the other face of the outer layer substrate 55, a conductive pattern is not provided but an insulating layer 58 is provided for adhering to the inner substrate 53. Of course, the conductive pattern may also be provided on the other face of the outer layer substrate 55. The outer layer substrate 55 has connection holes 74 to be engaged with the bumps 69 of the inner layer substrate 53. The connection holes 74 are not penetrated so that a part of the conductive pattern 72 at the bottoms of the connection holes 74 are made to be exposed to the outside. The exposed bottoms are to be lands 73a where the bump 69 of the inner layer substrate 53 is press-welded. The lands 73a and the bumps 69 of the inner layer substrate 53 are connected to each other through the conductive cement 14.

In the multilayer printed circuit board 51 described above, the interlayer connection is established by press-welding after engaging the conductive bumps 65, 66, 69 formed integrally on the conductive patterns 61, 62, 67 with the connection holes 68, 72, 74 formed on the substrates 53, 54, 55. The multilayer printed circuit board 51 is integrated by laminating the substrates 52, 53, 54, 55 where the bumps 65, 66, 69 are engaged with the connection holes 68, 72, 74 to be positioned and heat-pressed. Therefore, in the multilayer printed circuit board 51, the substrates 52, 53, 54, 55 can be laminated without displacement. In addition, in the multilayer printed circuit board 51, the bumps 65, 66, 69 and the lands 67a, 71a, 73a are connected to each other through the conductive cement 14 in the connection holes 68, 72, 74. Therefore, the conductive cement 14 can be prevented from spreading. Furthermore, generating of metal migration can also be prevented because only a single heat-pressing is enough to be performed. In addition, since the bumps 65, 66, 69 and the lands 67a, 71a, 73a are connected through the conductive cement 14, the interlayer connection is surely established. Further, the substrate 52, 53, 54, 55 are adhered each other with epoxy adhesive also serving as the insulating layer 56, 57, 58, the multilayer printed circuit board 51 can be produced thinner.

Finally, although the case of the five conductive layers has been described above, the number of the conductive layers may be varied. The embodiments and examples described above are only examples of the present invention. It should be noted that the present invention is not restricted only to such embodiments and examples, and various modifications, combinations and sub-combinations in accordance with its design or the like may be made without departing from the scope of the present invention.

What is claimed is:

1. A multi-layer circuit board comprising:
a first conducting pattern formed on a first substrate,
a second conducting pattern formed on a second substrate, and
conductive bumps that engage in connection holes formed in the first substrate and connect the first conducting pattern to the second conducting pattern through the connection holes, wherein
the conductive bumps are formed on the second substrate and are connected to the first conducting pattern by a conductive cement, and
the conductive cement includes colloidal particles dispersed within a dispersant, wherein,
after drying, the conductive cement is approximately 6% by weight dispersant and approximately 94% by weight colloidal particles.

2. The multi-layer circuit board according to claim 1, wherein
the first substrate and the second substrate are adhered together with an insulating adhesive.

3. The multi-layer circuit board according to claim 1, wherein
the insulating adhesive is an adhesive agent having the same or similar plasticity as the first substrate and the second substrates.

4. The multi-layer circuit board according to claim 1, wherein
the first conducting pattern or the second conducting pattern includes a copper foil.

5. The multi-layer circuit board according to claim 1, wherein
the colloidal particles include conductive colloidal particles, the conductive colloidal particles having a diameter of several nm to 100 nm.

6. The multi-layer circuit board according to claim 5, wherein
the conductive colloidal particles include silver colloidal particles.

7. The multi-layer circuit board according to claim 1, wherein
the colloidal particles include conductive colloidal particles, the conductive colloidal particles having a diameter of 10 nm to 50 nm.

8. The multi-layer circuit board according to claim 1, wherein
the dispersant is a resin having a molecular weight of about 10,000.

9. The multi-layer circuit board according to claim 1, wherein
the colloidal particles include adhesiveness-improving particles.

10. The multi-layer circuit board according to claim 9, wherein
the adhesiveness-improving particles include tin-silver alloy particles.

11. The multi-layer circuit board according to claim 10, wherein
the composition ratio of silver to tin in the tin-silver alloy particles is about 3.5 to 96.5.

12. The multi-layer circuit board according to claim 11, wherein
a tin-silver plating is provided on lands of the first conducting pattern where the conductive bumps connected to the first conducting pattern by a conductive cement.

13. The multi-layer circuit board according to claim 9, wherein
the adhesiveness-improving particles are larger than the colloidal particles.

14. The multi-layer circuit board according to claim 13, wherein
the adhesiveness-improving particles have an average diameter of 1 μm to 100 μm.

15. The multi-layer circuit board according to claim 14, wherein
the adhesiveness-improving particles have an average diameter of about 10 μm.

16. The multi-layer circuit board according to claim 9, wherein
the adhesiveness-improving particles include copper particles coated with silver.

17. The multi-layer circuit board according to claim 16, wherein
the copper particles coated with silver have a diameter of 10 μm to 100 μm.

18. The multi-layer circuit board according to claim 1, wherein
the colloidal particles include an exothermic material particles.

19. The multi-layer circuit board according to claim 18, wherein
the exothermic material particles include at least one selected from the group consisting of graphite, ferrite, silicon carbide, barium titanate, and alumina.

20. The multi-layer circuit board according to claim 1, wherein
the connection holes formed in the first substrate are non-penetrated connection holes.

* * * * *